(12) United States Patent
Götz et al.

(10) Patent No.: US 11,404,860 B2
(45) Date of Patent: Aug. 2, 2022

(54) DETECTION OF A PROTECTIVE CONDUCTOR FAILURE BY MEANS OF AN ACTIVE SHIELD

(71) Applicant: Dr. Ing. h.c. F. Porsche Aktiengesellschaft, Stuttgart (DE)

(72) Inventors: Stefan Götz, Forstern (DE); Steve Zander, Marbach am Neckar (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 601 days.

(21) Appl. No.: 15/962,444

(22) Filed: Apr. 25, 2018

(65) Prior Publication Data
US 2018/0335463 A1 Nov. 22, 2018

(30) Foreign Application Priority Data

May 19, 2017 (DE) .......................... 102017110955.2

(51) Int. Cl.
*G01R 1/00* (2006.01)
*H02H 1/00* (2006.01)
(Continued)

(52) U.S. Cl.
CPC .......... *H02H 1/0084* (2013.01); *G01R 31/52* (2020.01); *H02H 3/14* (2013.01)

(58) Field of Classification Search
CPC ........ G01R 31/08; G01R 31/50; G01R 31/52; G01R 31/54; G01R 31/58; H02H 5/105;
(Continued)

(56) References Cited

U.S. PATENT DOCUMENTS

| 6,218,647 B1 * | 4/2001 | Jones .................... E04D 13/103 |
| | | 219/213 |
| 7,915,898 B1 * | 3/2011 | Kraemer .............. G01R 31/001 |
| | | 324/527 |

(Continued)

FOREIGN PATENT DOCUMENTS

| DE | 102012219457 A1 | 7/2013 |
| DE | 102014210290 A1 | 12/2015 |

(Continued)

OTHER PUBLICATIONS

German Search Report for German Application No. 10 2017 110 955.2, dated Dec. 15, 2017 with partial English translation, 7 pages.

*Primary Examiner* — Alvaro E Fortich
(74) *Attorney, Agent, or Firm* — RatnerPrestia (57) ABSTRACT

Method for detecting a protective conductor failure inside a cable including a plurality of conductors, in which at least one conductor has a shield and this shield is respectively connected to a potential at a first end and at a second end of the cable, wherein, in order to drive its potential to a predefined potential value, the shield is actively electrically supplied at at least one end of the cable. In this case, the cable may be a charging cable which is connected, by the first end, to a charging pole and is connected, by the second end, to a battery configured to be installed in an electric vehicle, and the shield is actively supplied at the first end of the cable which is connected to the charging pole.

23 Claims, 7 Drawing Sheets

(51) Int. Cl.
*G01R 31/52* (2020.01)
*H02H 3/14* (2006.01)

(58) Field of Classification Search
CPC .. H02H 3/14; H02H 3/16; H02H 3/17; H02H 1/0084; Y02T 10/70; Y02T 10/7072; B60L 3/04; B60L 53/18; B60L 53/14
See application file for complete search history.

(56) References Cited

U.S. PATENT DOCUMENTS

| | | | |
|---|---|---|---|
| 9,696,743 B1* | 7/2017 | Treichler | G05F 3/02 |
| 2008/0036466 A1* | 2/2008 | Raber | G01R 31/52 |
| | | | 324/509 |
| 2011/0216452 A1* | 9/2011 | Haines | H02H 3/00 |
| | | | 361/42 |
| 2012/0161778 A1* | 6/2012 | Fernandez Banares | |
| | | | G01R 31/52 |
| | | | 324/503 |
| 2013/0194101 A1* | 8/2013 | Devupalli | G01R 31/58 |
| | | | 340/664 |
| 2013/0258531 A1 | 10/2013 | Li et al. | |
| 2014/0104732 A1* | 4/2014 | Schult | H01H 83/02 |
| | | | 361/42 |
| 2015/0346253 A1 | 12/2015 | Haeuslein | |

FOREIGN PATENT DOCUMENTS

| | | | | |
|---|---|---|---|---|
| DE | 102015004836 A1 * | 10/2016 | | B60L 50/51 |
| EP | 1114752 A2 | 7/2001 | | |
| EP | 3034350 A1 | 6/2016 | | |
| WO | WO-2016137424 A1 * | 9/2016 | | G01R 31/1263 |

* cited by examiner

DETECTION OF A PROTECTIVE CONDUCTOR FAILURE BY MEANS OF AN ACTIVE SHIELD

CROSS-REFERENCE TO RELATED APPLICATIONS

This application claims priority to German Patent Application No. DE 10 2017 110 955.2, filed May 19, 2017, which is incorporated by reference herein in its entirety.

FIELD OF THE INVENTION

The present invention relates to a method and a system for detecting a protective conductor failure by actively electrically supplying a shield.

BACKGROUND OF THE INVENTION

Batteries in modern electric vehicles generally allow two charging modes. In a first charging mode for charging at a conventional AC voltage or three-phase socket—a so-called AC charging mode—the electric vehicle has an on-board charging device which both carries out a necessary conversion into direct current and controls charging operation. However, this AC charging mode is enormously restricted on account of a low available connection power of generally no more than 16 A or 32 A and on account of restricted installation possibilities for the on-board charging device with sufficient power at a charging speed. This results in charging times of several hours for each 100 km of expected driving performance.

On account of the high charging times, a second charging mode with DC voltage—a so-called DC charging mode—was developed. In contrast to AC charging, the electric vehicle does not have its own charging device in this case. Instead, a charging pole outside the vehicle carries out a charging operation and forms voltage and current in the manner needed to charge the battery. In this case, a DC charging current line is directly connected to a pole of a high-voltage battery of the electric vehicle during the charging operation. There is no DC isolation between the DC charging current lines and the battery. The power of DC charging stations is currently up to 50 kW. In order to bring the charging time to orders of magnitude which correspond to the refueling of combustion vehicles, powers of more than 300 kW with charging voltages of up to 1000 V are required, however. Details of DC charging and the corresponding operations in a charging system and an electric vehicle are described, for example, in DIN EN 61851, which is incorporated by reference herein.

The charging operation is largely controlled by the vehicle. Communication between the charging pole and the vehicle takes place digitally in this case, usually via separate signal conductors in a charging cable. The signal conductors run in the immediate environment of the DC charging current lines which can have very high currents and voltages and transients of the two, as a result of which there is the risk of capacitive coupling, in particular on account of the high voltages.

In order to minimize interference on the signal conductors, they are usually provided with at least one shield, as is known from the prior art. In order to optimally suppress interference, the shields are usually also connected on both sides, that is to say to a metal housing of the charging pole, to a component of the charging pole or to a protective conductor (referred to as PE—protective earth—the technical jargon) at one end and to a body or to a PE connection of a charging socket of the electric vehicle on the other side. This connection can also be effected indirectly, for example via a connector pin or a connector housing, if they have a connection to a PE conductor or to an associated housing.

Whereas electric vehicles generally do not have any grounding or a PE conductor, but rather are DC-isolated, during conventional operation (exceptions are rescue vehicles which carry out grounding with the road for the on-board medical devices), they must be grounded during the charging operation according to current rules (for example EN 61851, which is incorporated by reference herein). For this purpose, the body of the electric vehicle, which is also used as the reference potential for the 12 V vehicle electrical system, is connected to the PE conductor of the charging system. In the event of a failure, the charging operation must be aborted in order to rule out a threat to persons. The failure of a PE connection must be accordingly detected. For this purpose, the charging cable generally also comprises a PE conductor in addition to the charging current lines, signal lines and shields already described.

However, such PE conductors and the shields connected on both sides now run in an approximately electrically parallel manner. In this case, differences in resistances between electric& paths via PE conductors and shields are either very small or undefined. In contrast to the PE conductor which must be configured with a very large cross section and good contact-making means on both sides in order to enable high potential equalization currents and high fault currents in the event of a fault, the shields are generally only thin metal films or shield braids. If there is a high current flow in them, they may be thermally overloaded, on the one hand, and there is a risk of inductive interference being impressed into the signal conductors, on the other hand.

Whereas the current flow to shields can be prevented or reduced during regular operation, the shield automatically, but undesirably, assumes the function of the PE conductor in the event of a fault if the PE conductor in the charging cable is interrupted or its connection on one side is interrupted. On account of the obligation to provide vehicle grounding via the PE conductor according to EN 61851, which is incorporated by reference herein, this connection in the charging system must be interrupted without faults. However, previous methods can no longer perform the function of interrupting the connection in the charging system if there is simultaneously a shield which is connected on both sides and can actually maintain the function of the PE conductor within its load limits, but does not have a necessary current-carrying capacity in any way.

A loss of the PE connection is conventionally detected via a potential shift of the electric vehicle or insulation monitoring. In the latter case, there is a further connection to the body, for example. If the PE connection fails, either the body can be capacitively charged in a measurable manner, thus producing an electrical voltage between the vehicle and the ground potential of the charging station which can be S detected via an additional monitoring conductor, or a current injected into the additional monitoring conductor no longer flows back into the charging pole via the PE connection.

Document DE 102012219457, which is incorporated by reference herein, is cited as an example of a protective switching apparatus for detecting a fault current in a three-wire power supply system, in which case two power supply conductors and one protective conductor each have one switch. The protective switching apparatus additionally provides a capture device for capturing a fault current in the system of the three conductors and for generating a corresponding capture signal. It also has a control device for controlling the respective switch on the basis of the capture signal, in which case the switch of the protective conductor is opened only when a fault current is captured when a switch of the power lines is respectively open.

The document EP 3034350, which is incorporated by reference herein, discloses a safety method for a charging system of electric vehicles, in which the interruption in the protective conductor during a charging operation is detected by virtue of particular currents within the charging system exceeding a threshold value.

The document US 2013258531, which is incorporated by reference herein, discloses a similar system in which a protective conductor fault is detected by capturing the voltage at the protective conductor itself.

However, if a shield connected to the PE conductor on both sides is simultaneously present, methods from the prior art can no longer detect a failure of the PE conductor. Any further detectable symptoms of a failing PE conductor are likewise absent since there is still—albeit inadequate—potential equalization via the shield.

SUMMARY OF THE INVENTION

Against this background, an object of the present invention is to provide a method and a system for detecting a failure of a protective conductor if a shield of a further conductor is connected to both ends of the protective conductor.

In order to achieve the object mentioned above, a method for detecting a protective conductor failure inside a cable comprising a plurality of conductors is presented. The cable comprises a first end and a second end. At least one conductor of the cable has a shield which is connected to a potential at at least one end of the cable. In order to drive the potential of the shield to a predefined potential value, it is actively electrically supplied at at least one potential connection. The protective conductor failure is detected by virtue of an electrical variable occurring during active supply exceeding at least one limit value.

In one configuration of the method according to aspects of the invention in which the shield is actively supplied at least at the first end of the cable, it is connected to a potential at the second end of the cable, in which case the potential connection can be effected indirectly by means of electrical components or directly.

In a further configuration of the method according to aspects of the invention, the shield is actively supplied at the first end of the cable and remains freely suspended at the second end of the cable, that is to say without a connection.

The cable may be a charging cable which is connected, by the first end, to a charging pole and is connected, by the second end, to a battery which can be installed in an electric vehicle. In the case of an electric vehicle, the second end of the charging cable is formed by a connector which is plugged into a charging socket of the electric vehicle. The shield is advantageously actively supplied at the first end of the cable which is connected to the charging pole. The charging cable may comprise a plurality of conductors, including at least two live conductors, at least one protective conductor and at least one further conductor which is used to transmit signals. A signal conductor is advantageously provided with a shield.

The shield can be indirectly electrically connected via electrical components having a frequency-selective filter effect. The filter effect is preferably designed such that there is a low impedance in the frequency range of at least one signal which is transmitted via the at least one shielded signal conductor. Furthermore, there may be a high impedance at least at one point outside the frequency range of the at least one signal transmitted via the at least one shielded signal conductor. In a particularly preferred manner, the total bandwidth of the frequency range with a high impedance is greater than the bandwidth of the frequency range with a low impedance. The frequency range with a high impedance of the electrical components can include the DC component at approximately 0 Hz, in particular. The frequency range with a high impedance may likewise approximately comprise the predominant part of the frequency range above the frequency range of the at least one signal transmitted via the at least one shielded signal conductor and may therefore have a low-pass filter effect in this range.

A low impedance is preferably in the range of the line terminating impedance of the at least one signal conductor; for example, a low impedance is preferably below 1000 ohms, particularly preferably below 120 ohms or even below 50 ohms. A high impedance in the sense of the invention is at least 10 times the low impedance, particularly preferably at least 100 times the low impedance. According to current rules in the USA and Europe (IEC 61851, IEC 62196, SAE J1772), the frequency range of the at least one signal may be 1 kHz for the so-called Control Pilot (CP) and 1-30 MHz for the so-called Power-Line Communication, for example.

According to aspects of the invention, the potential of the protective conductor is driven to a predefined potential value by means of active supply, in which case the potential is based on a ground potential as a reference. It may advantageously also correspond to the latter. Potentials from the charging station or from the electric vehicle can be used as references for a further reference potential.

The shield is actively supplied via an electrical circuit which, in the simplest case, controls a voltage. This is advantageously an amplifier circuit in which an amplifier, in particular an operational amplifier, impresses the potential with the predefined potential value into the shield. In order not to react to interference from interference fields at full amplitude and to not be oscillatory, a gain relative to a reference potential of less than 1 can be selected.

Furthermore, the electrical circuit used for the active supply can control a current needed to reach the predefined potential value. As a result, an increased degree of stability is achieved for the active supply in the event of severe potential fluctuations and interference from interference fields.

According to aspects of the invention, the electrical circuit allows spectral filtering of the potential to be set by means of voltage control or of the current to be driven. The electrical circuit can be controlled in such a manner that the shield is driven to a filtered form of the potential.

Furthermore, the spectral filtering can be used to cover, in particular, that spectra range which is also used during signal transmission. Lower and higher frequency ranges can be accordingly attenuated. Ground loops which are susceptible to inductive interference can therefore be attenuated using further shields which are possibly present or the PE conductor. Such ground loops are excited, in particular, at those frequencies which are present in the environment with sufficient electromagnetic power. This concerns, in particular, the mains frequency of 50 Hz in Europe and 60 Hz in the USA, which is known, for example, as 50 Hz or 60 Hz humming in audio systems or sensitive measuring amplifiers. A few high-frequency bands from communication technology also carry sufficient power for such excitation, for example long-wave and medium-wave radio in the vicinity of transmitting devices. Furthermore, charging electronics of the charging system, in particular, generate switching interference which can produce sufficient power for exciting ground loops. If corresponding frequency components are attenuated or suppressed by the amplifier during active supply of the shield, a resonance capability of the interference can be prevented or the interference can even be completely suppressed.

Generally, a shield must mainly shield interference in the spectral range of signal transmission. If interference has only a narrow bandwidth, it can be effectively suppressed or separated using simple known techniques in the input stages of signal receiving electronics of the electrical circuit for actively supplying the shield. In this case, the spectral filtering may be first-order passive filtering, higher-order filtering or active filtering (for example shown by the circuit diagrams in FIGS. 4, 5 and 6).

The electrical circuit used to actively supply the shield advantageously makes it possible to both accurately monitor the current to be driven for the purpose of reaching the predefined potential value and to check it by means of active control. A power produced in the electrical circuit and a power loss and heating of the shield can be restricted and limited in this manner. This makes it possible to avoid driving the current into a short circuit or into the shield which is unintentionally used as a substitute in the event of protective conductor failure. In addition, further possible faults such as a short circuit between the shield or protective conductor and another line or the loss of a protective conductor connection to the electric vehicle can be detected in this manner.

Furthermore, the amplifier circuit can influence an amplitude of the current used for the active supply by means of scaling and/or a transformation which is carried out in a non-linear manner, in particular. For example, it is possible to carry out conventional compression which reduces the gain for high amplitudes or even saturates it at a desired maximum in the limiting case. If the protective conductor is interrupted, this saturation or compression can prevent a large current from forming at the shield. Such a non-linear amplitude transformation is also referred to as a dynamic range transformation.

High amplitudes in the current to be set for the active supply indicate either powerful interference in the shield, a ground loop or a protective conductor failure. This applies, in particular, when they are currents with a high amplitude but low frequencies. A shield which is directly connected on both sides could result in the flow of a current which would be limited only in the impedance of the connection and could therefore overload a connection of the shield. In contrast, the active supply of the current according to aspects of the invention allows a limitation to amplitudes for which the shield is designed and/or a reduction in the current to be set the more it reaches amplitudes which are unusual for the fault-free case (for example achieved by the transfer function in FIG. 3).

In one configuration of the method according to aspects of the invention, the current to be driven can be monitored and/or checked directly by means of a setting signal which, as the result of a feedback loop, directly reflects the current intensity to be driven by the amplifier. Alternatively, the driven current can be measured via a shunt resistance which may be very large and therefore provides a high degree of accuracy. A large shunt resistance is possible since the amplifier can virtually completely compensate for this resistance with suitable feedback, with the result that a virtual impedance between the protective conductor and the shield, shown in FIG. 2 for example, is not impaired.

According to aspects of the invention, a protective conductor failure can be determined by limit values being exceeded in the current to be driven. In this case, the current to be supplied to the shield directly reflects a quality of the PE connection. If the PE connection to the vehicle breaks, the equalization current must inevitably flow via the shield. A current required or measured by the electrical circuit can therefore be used as a reliable indicator of a lost PE connection if certain limits are exceeded. Such limits may be formed individually or in combination as follows, for example:

Absolute switch-off threshold: if the instantaneous current exceeds a predefined absolute value, a fault in the PE connection is assumed. The charging operation is switched off and the voltage at the connector is discharged.

Maximum permissible charge (charge threshold): if the integral of the instantaneous current exceeds a predefined absolute value, a fault in the PE connection is assumed. The charging operation is switched off and the voltage at the connector is discharged.

Maximum permissible current rise with the simultaneous presence of a high current amplitude (current rise threshold): if the current rises from an already increased value (which is generally lower than the predefined absolute value for the absolute switch-off threshold) with a high gradient, a fault in the PE connection is assumed. The charging operation is switched off and the voltage at the connector is discharged.

In addition to the voltage control, additional current control is advantageously configured in such a manner that the respective control operates with a respective limit for voltage and current and that limit which results in a smaller output current in terms of the absolute value (that is to say irrespective of a possible sign for the voltage or current) respectively determines the current to be driven.

Further possible limits when actively controlling the current to be driven are formed by a largely stable current limit designed for loadability of the shield, a maximum current limit derived from the maximum power loss of the electrical circuit, a maximum current limit derived from a temperature of an electrical component of the electrical circuit, or a current limit which is slightly above the limit needed to clearly detect a PE loss. The values of the current limits can be adapted to the limits of the loadability of all components involved.

Before starting the charging operation, the method according to aspects of the invention, makes it possible to energize the shield for test purposes by means of the active supply, in which case a resulting change in the potential of the shield indicates a protective conductor failure. The energization for test purposes is carried out irrespective of the reference potential to which the electrical circuit usually drives. If this current is not dissipated by an intact PE conductor, for example, the body of the electric vehicle is charged with respect to the ground potential or a further potential of the charging station. Successful charging of the body of the electric vehicle therefore indicates a protective conductor failure. The associated change in the potential of the shield can be determined by virtue of a limit value being exceeded in a differentiating element inside the electrical circuit.

In one configuration of the method according to aspects of the invention, it is also possible to test for a protective conductor failure by energizing the shield for test purposes by means of the active supply and actively interrupting a connection between the protective conductor and the ground potential in the charging pole. In the case of an intact PE conductor, a rising potential of the body of the electric vehicle and also in the PE conductor can then be detected or can also be determined here by virtue of a limit value being exceeded at a differentiating element.

A system is also claimed which is designed so as to carry out the described method in a suitable manner.

A system for detecting a protective conductor failure inside a cable comprising a plurality of conductors is provided, in which the cable comprises a first end and a second end, and in which at least one conductor has a shield and this shield is connected to a potential at at least one end of the cable. The system comprises at least one electrical module which is designed to actively supply the shield at at least one potential connection and a detection unit which is designed to detect a protective conductor failure if an electrical variable occurring during active supply exceeds at least one limit value.

According to one possible configuration of the system according to aspects of the invention, the electrical module is implemented as an IC (integrated circuit) or by means of a plurality of coupled ICs.

In another configuration, the electrical module comprises at least one electrical component from the group consisting of: integrating element, differentiating element, amplifier element, threshold value exceeding element.

Further advantages and configurations of the invention emerge from the description and the accompanying drawings.

It goes without saying that the features mentioned above and the features yet to be explained below can be used not only in the respectively stated combination but also in other combinations or alone without departing from the scope of the present invention.

BRIEF DESCRIPTION OF THE DRAWINGS

The FIGS. are described cohesively and comprehensively and the me compos eats are assigned to the same reference symbols.

DETAILED DESCRIPTION OF THE INVENTION

Figure 1:
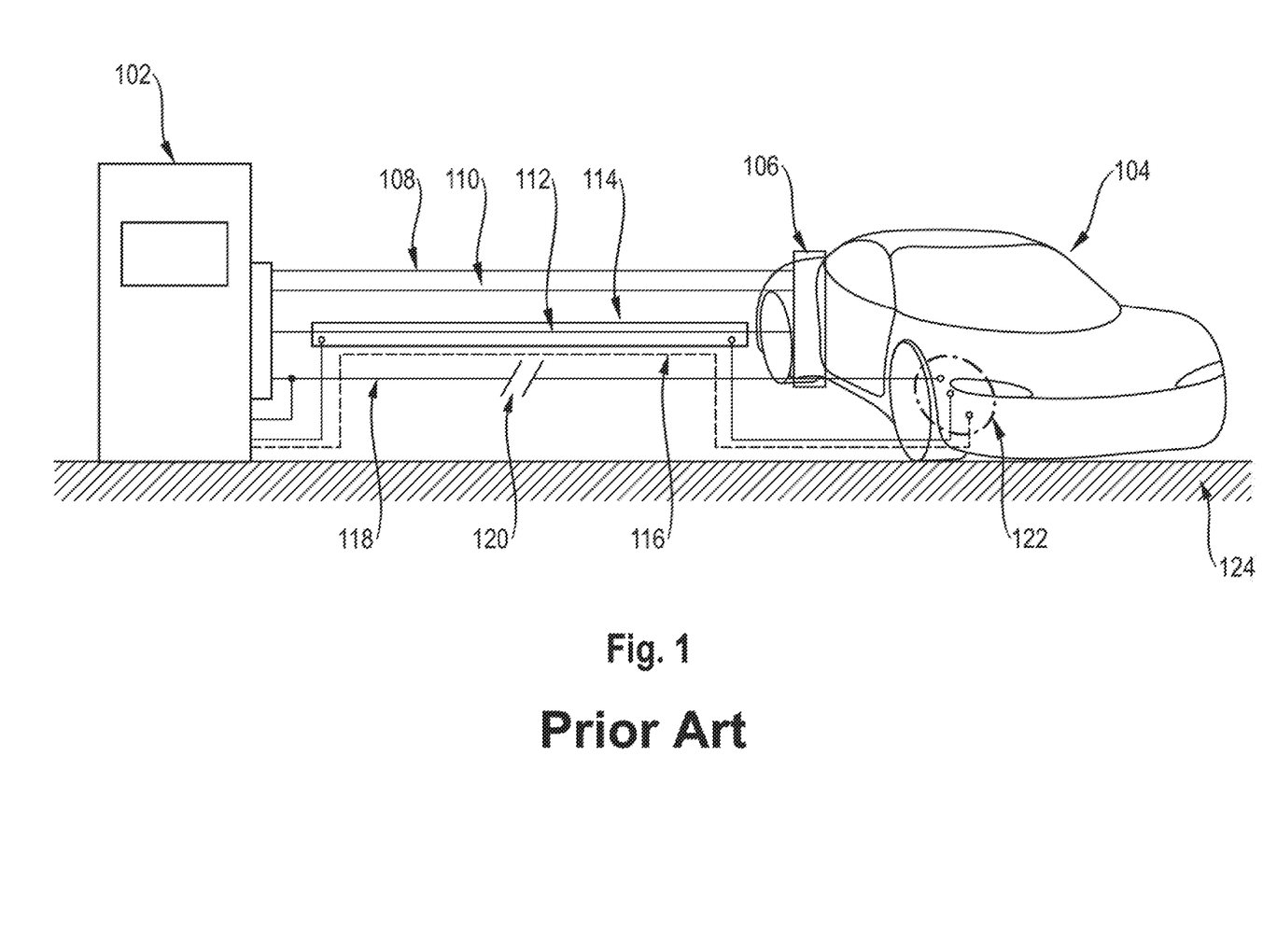
FIG. 1 shows a schematic illustration according to the prior art of the course of a line between a charging pole and an electric vehicle, in which the protective conductor is interrupted.

FIG. 1 schematically illustrates the possible course of a line between a charging pole 102 and an electric vehicle 104, as known from the prior art. The cable running from the charging pole 102 to a charging socket 106 comprises two lines 108 and 110 which conduct charging current, a conductor 112 surrounded by a shield 114, and a protective conductor 118. An electrical short between the shield 114 and the protective conductor 118 can be effected, on the side of the electric vehicle 104, directly or indirectly outside the charging socket 106 via a point 122 on the body. If the protective conductor in the cable is interrupted at the point 120, a possible fault current alternatively flows, via the shield, back to the charging pole 102, schematically illustrated by a virtual line 116, since the electric vehicle 104 is electrically insulated with respect to the ground potential 124. Such a protective conductor failure therefore cannot be detected using the previous methods known from the prior art.

Figure 2:
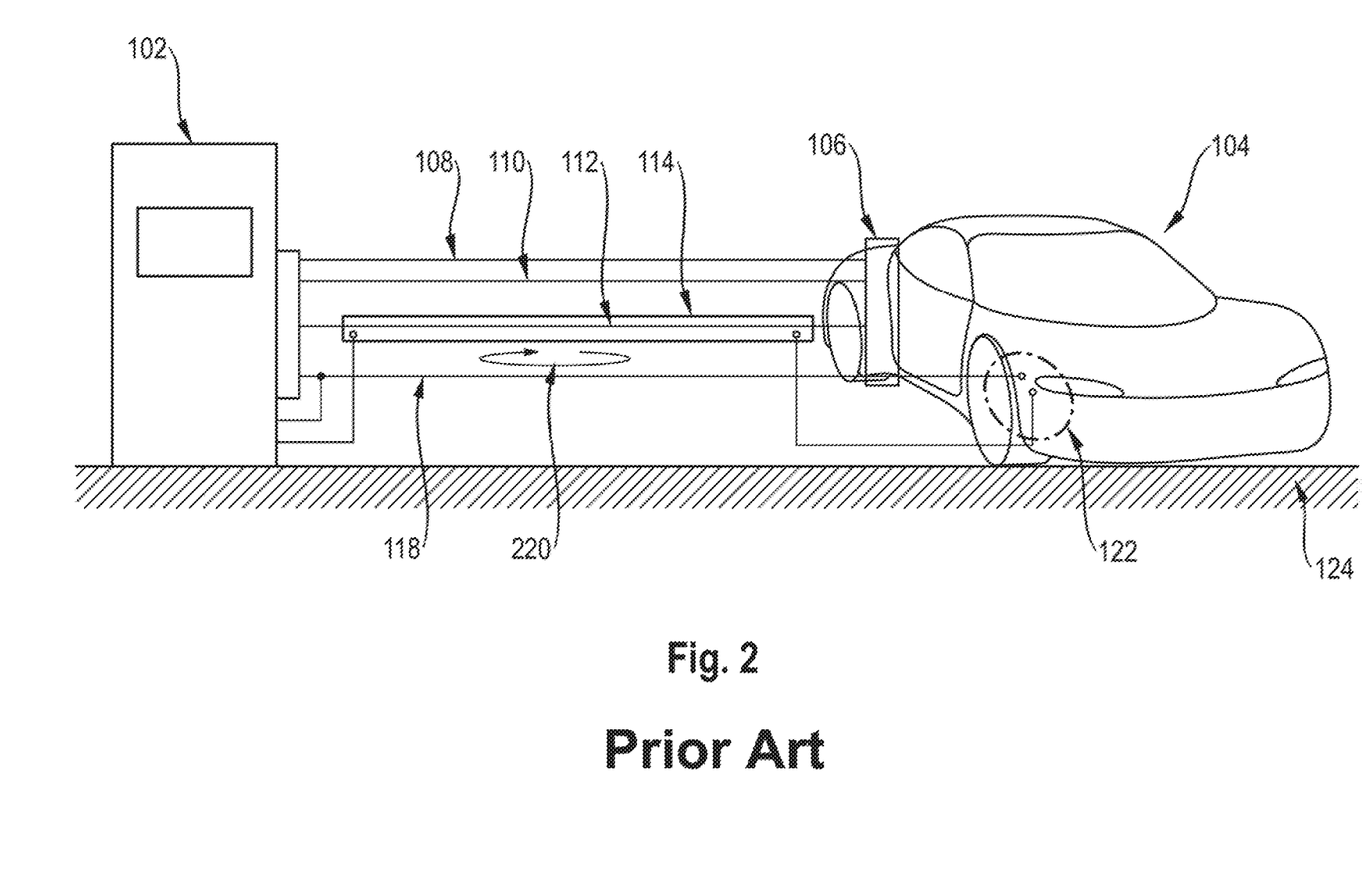
FIG. 2 shows a schematic illustration according to the prior art of the course of a line between a charging pole and an electric vehicle, in which an impedance is formed by the line shorting between a shield and a protective conductor.

FIG. 2 shows a schematic illustration of the same course of a line as in FIG. 1, but without an interruption of the protective conductor 118 in the cable. A so-called ground loop having an inductance 220 exists as a result of a line short at the point 122 on the body and grounding of the shield 114 and of the protective conductor 118 taking place at the charging pole 102.

Figure 3:
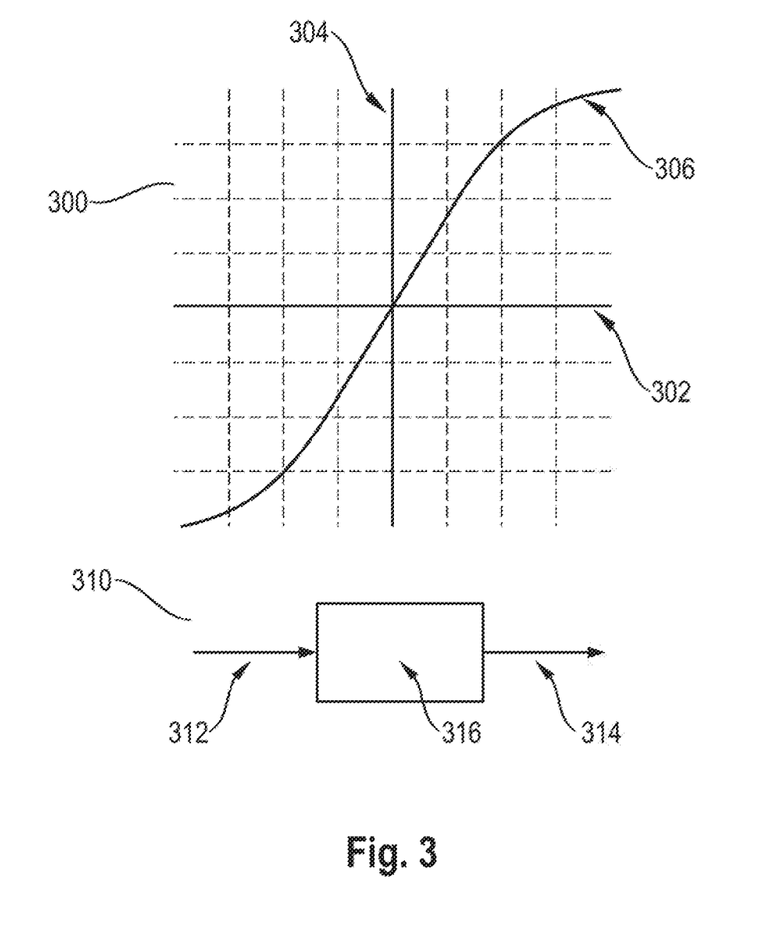
FIG. 3 shows a transfer function for the current to be driven, which function is carried out by an electrical component configured for this.

FIG. 3 shows a diagram 300 of a non-linear transfer function 306, also referred to as a dynamic range transformation, with an input 302 and an output 304, which function is carried out in the electrical equivalent circuit diagram 310 by the electrical component 316 with an input current 312 and an output current 314. In order to drive the potential of the protective conductor to a predefined potential value, a current 302 or 312 is required. By means of the electrical component 315, the active supply of the current according to aspects of the invention implements a limitation to amplitudes for which the shield is designed and/or reduces the current to be set the more it reaches amplitudes which are unusual for the fault-free case.

Figure 4:
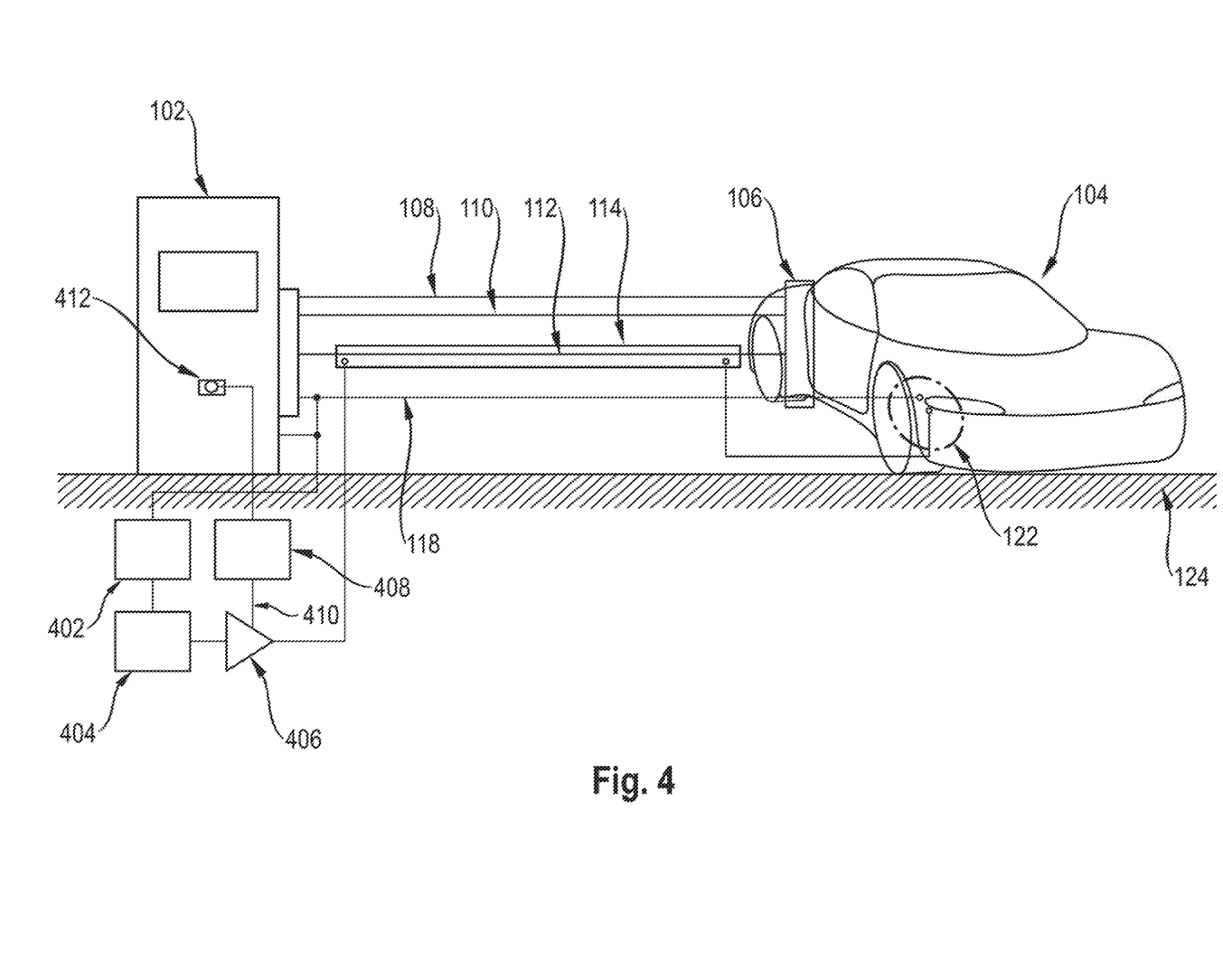
FIG. 4 shows a schematic illustration of the introduction of an electrical circuit, which implements one embodiment of the method according to aspects of the invention, in the course of the line on the side of the charging pole.

FIG. 4 shows a schematic illustration of the basic introduction of the electrical circuit according to aspects of the invention in the course of the line on the side of the charging pole. A signal from a reference potential of the protective conductor 118 is transmitted, by means of the dynamic range transformation 402 which implements signal compression for example, in a non-linear manner to a frequency filter 404, is subjected to spectral filtering there and is passed to the amplifier (or driver) 406. The amplifier 406 connected to the shield 114 at the output generates a supply current 410 which is checked with respect to selected switch-off rules in a switch-off component 408, which results in the charging operation being aborted in the event of infringement in the safety switch-off system 412.

Figure 5:
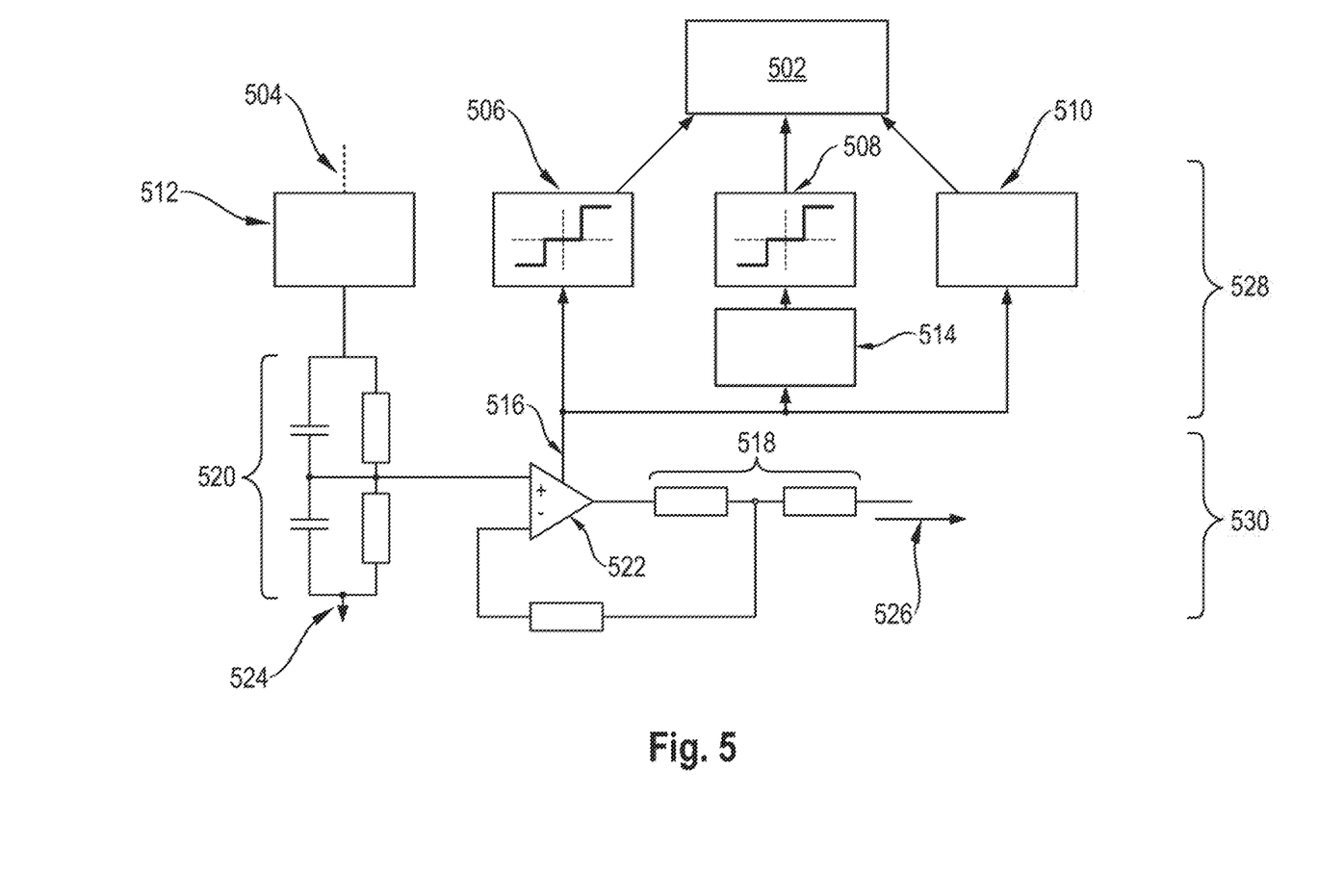
FIG. 5 shows a first electrical equivalent circuit diagram of electrical circuit, which implements one embodiment of the method according to aspects of the invention, for first voltage control with current limitation.

FIG. 5 shows a first electrical equivalent circuit diagram of an electrical circuit, which implements one embodiment of the method according to aspects of the invention, for first voltage control with current limitation. The electronic components 402, 404, 406 and 408 described in FIG. 4 can be divided into a monitoring part 528, which comprises the dynamic range transformation 512 and the switch-off component, which may consist of a threshold value switch-off 506, a charge switch-off 508 with preceding short-term integration 514, and a component 510 taking into account further safety limits, and an actuator part 530 comprising an exemplary frequency filter 520, the amplifier or driver 522 and optional current limitation and a protective impedance 518. A connection to the protective conductor 118 is present at the input 504 of the dynamic range transformation 512 as a reference potential to be approximately driven. The frequency filter 520, whose electronic components shown here represent any desired frequency filter for example, has a connection 524 to a reference potential. The supply current 516 coming from the amplifier 522 is checked in the switch-off component with respect to the switch-off rules implemented using the components 506, 508, 510 and 514, which results in the charging operation being aborted in the event of infringement in the safety switch-off system 502 in the charging pole. The signal coming from the amplifier 522 is passed to the shield connection 526 of the shield 118 via current limitation and a protective impedance 518, which can be optionally carried out.

Figure 6:
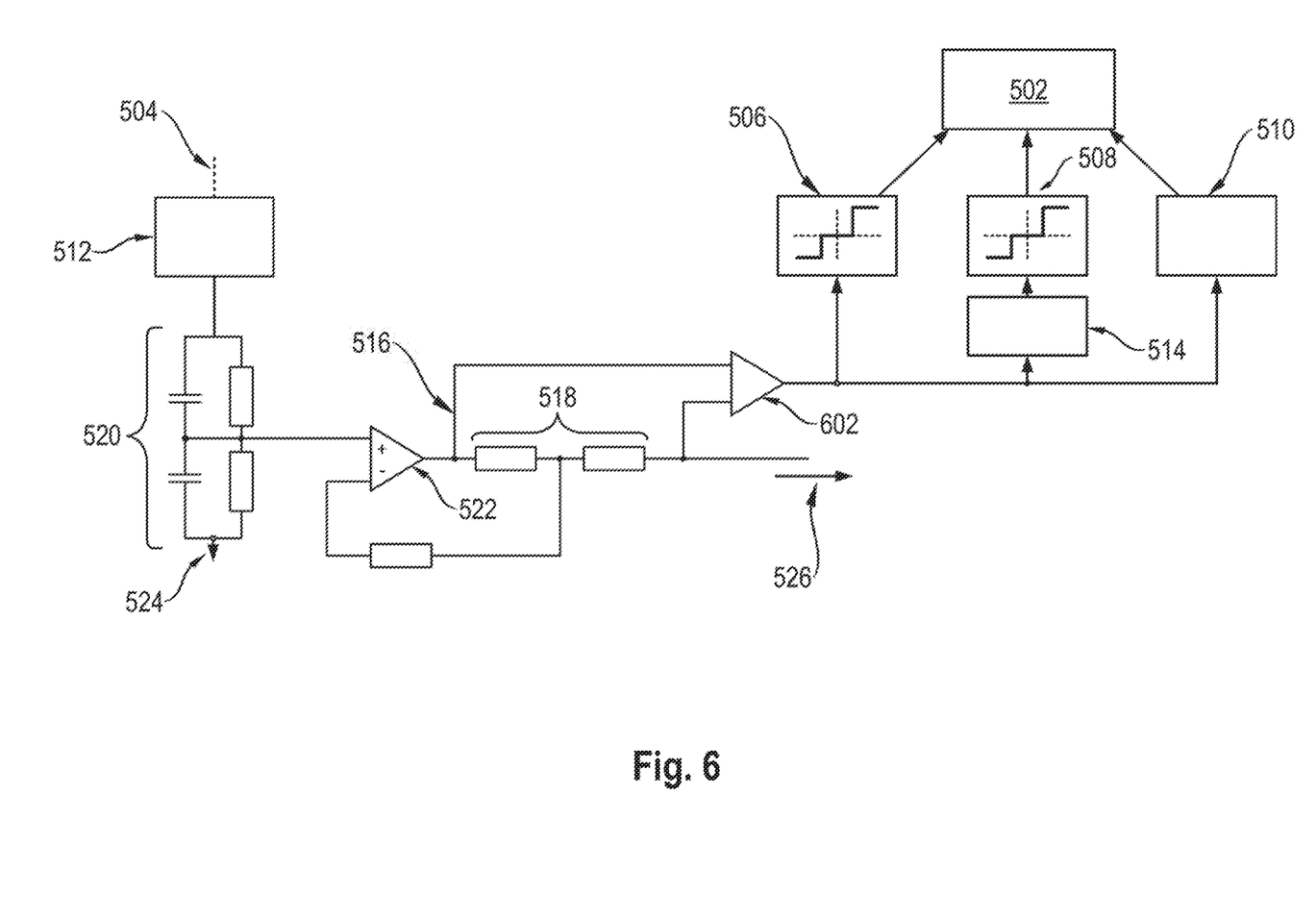
FIG. 6 shows a second electrical equivalent circuit diagram of an electrical circuit, which implements a further embodiment of the method according to aspects of the invention, for second voltage control with current limitation.

FIG. 6 shows a second electrical equivalent circuit diagram of an electrical circuit, which implements a further embodiment of the method according to aspects of the invention, for second voltage control with current limitation. The supply current 516 provided by the amplifier 522 is supplied, together with the signal received from the current limitation and protective impedance 518, to a differential amplifier or instrumentation amplifier 602, the output from which is passed to the switch-off component comprising the components 506, 508, 510 and 514.

Figure 7:
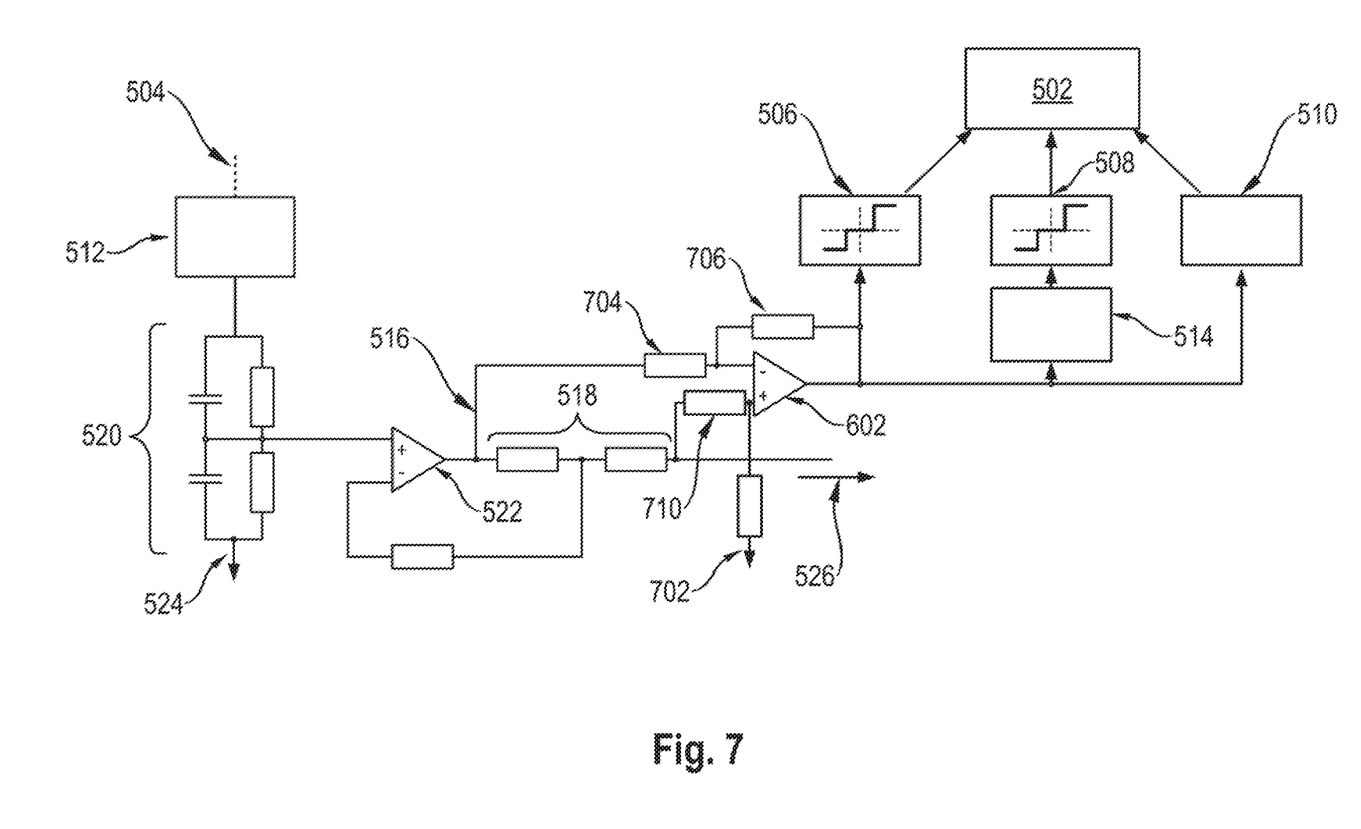
FIG. 7 shows a third electrical equivalent circuit diagram of an electrical circuit, which implements yet another embodiment of the method according to aspects of the invention, for third voltage control with current limitation.

FIG. 7 shows a third electrical equivalent circuit diagram of an electrical circuit, which implements yet another embodiment of the method according to aspects of the invention, for third voltage control with current limitation. The supply current 516 coming from the amplifier 522 or the signal obtained after current limitation and the protective impedance 518 is subjected to further resistances/impedances 704, 706, 710 or is referenced to a reference potential 702.

What is claimed is:

1. A method for detecting a protective conductor failure inside a cable comprising a plurality of conductors, in which the cable comprises a first end and a second end, and in which at least one conductor has a shield and this shield is connected to a potential by a potential connection at at least one end of the cable, wherein the method comprises:
actively electrically supplying to the potential connection of the at least one conductor an electrical supply current from a current source in order to drive a shield potential of the shield to a predefined potential value, and
detecting a failure of the protective conductor when an electrical variable occurring during the actively electrically supplying exceeds at least one limit value, the electrical variable being the electrical supply current that drives the shield potential of the shield measured at a circuit location upstream of the shield between the current source and the potential connection.

2. The method as claimed in claim 1, in which the shield is actively supplied at least at the first end of the cable and is connected to the potential at the second end of the cable, in which case the potential connection can be effected indirectly by means of electrical components or directly.

3. The method as claimed in claim 2, in which the second end of the cable is connected to the potential, in which case the potential connection is effected indirectly by means of electrical components having frequency-selective filter properties.

4. The method as claimed in claim 3, in which the electrical components having frequency-selective filter properties of the indirect potential connection at the second end of the cable have a low electrical impedance in a used spectral range of electrical signals of the at least one conductor and have a high electrical impedance in at least one frequency range outside the used spectral range of the electrical signals of the at least one conductor.

5. The method as claimed in claim 1, in which the shield is actively supplied at the first end of the cable and is freely suspended at the second end of the cable.

6. The method as claimed in claim 1, in which the cable is a charging cable which is connected, by the first end, to a charging pole and is connected, by the second end, to a battery configured to be installed in an electric vehicle, the shield is situated around a conductor used to transmit signals between the charging pole and the electric vehicle, and the shield is actively supplied at the first end of the cable which is connected to the charging pole.

7. The method as claimed in claim 1, in which the predefined potential value is based on a ground potential of the protective conductor, as a result of which the potential of the shield corresponds to the potential of the protective conductor.

8. The method as claimed in claim 1, in which the actively electrically supplying is effected in a voltage-controlled manner via an electrical circuit.

9. The method as claimed in claim 8, in which the electrical circuit is effected by an amplifier circuit which contains an operational amplifier.

10. The method as claimed in claim 8, in which the electrical circuit used for the actively electrically supplying controls a current needed to reach the predefined potential value.

11. The method as claimed in claim 8, in which the electrical circuit carries out spectral filtering of the potential to be set by means of voltage control or of the current to be driven.

12. The method as claimed in claim 8, in which the electrical circuit used for actively electrically supplying the shield at least one of monitors or checks the current to be driven in order to reach the predefined potential value.

13. The method as claimed in claim 12, in which an amplifier circuit influences an amplitude of the current used for the active supply by means of at least one of scaling or a non-linear transformation.

14. The method as claimed in claim 13, in which the at least one of monitoring or checking is carried out by a setting signal derived at the amplifier or by measuring the driven current at a shunt resistance.

15. The method as claimed in claim 1, in which the at least one limit value is an absolute switch-off threshold, such that if an instantaneous supplied current exceeds a predefined absolute value, the failure is detected, and a charging operation is switched off.

16. The method as claimed in claim 6, in which the shield is energized for test purposes, in which case a change in the potential of the shield indicates a protective conductor failure.

17. The method as claimed in claim 6, in which a connection to the protective conductor in the cable with its end at the charging pole is disconnected from the ground potential, the shield is energized for test purposes, and a rise in its potential indicates an intact protective conductor.

18. A system for detecting a protective conductor failure inside a cable comprising a plurality of conductors, in which the cable comprises a first end and a second end, and in which at least one conductor has a shield and this shield is connected to a potential at at least one end of the cable, the system comprising:

at least one electrical module which is designed to actively supply the shield at at least one potential connection with an electrical supply current from a current source; and     a detection unit configured to detect a protective conductor failure if an electrical variable occurring during active supply exceeds at least one limit value, the electrical variable being the electrical supply current that drives the shield potential of the shield measured at a circuit location upstream of the shield between the current source and the potential connection.

19. The system as claimed in claim 18, in which the electrical module is implemented as an integrated circuit (IC) or by means of a plurality of coupled ICs.

20. The system as claimed in claim 18, in which the electrical module comprises at least one electrical component from the group consisting of: integrating element, differentiating element, amplifier element, and threshold value exceeding element.

21. The system as claimed in claim 18, which is configured to actively electrically supply at the potential connection of the at least one conductor the potential in order to drive a shield potential of the shield to a predefined potential value, and detect a failure of the protective conductor when an electrical variable occurring during the actively electrically supplying exceeds at least one limit value.

22. A method for detecting a protective conductor failure inside a cable comprising a plurality of conductors, in which the cable comprises a first end and a second end, and in which at least one conductor has a shield and this shield is connected to a potential by a potential connection at at least one end of the cable, wherein the method comprises:

actively electrically supplying at the potential connection of the at least one conductor the potential in order to drive a shield potential of the shield to a predefined potential value, and     detecting a failure of the protective conductor when an electrical variable occurring during the actively electrically supplying exceeds at least one limit value, the electrical variable being an electrical current that drives the shield potential of the shield measured at a circuit location upstream of the potential connection, the at least one limit value being a current integral threshold, such that if an integral of an instantaneous supplied current exceeds a predefined absolute value, a fault is detected, and a charging operation is switched off.

23. The method as claimed in claim 1, in which the at least one limit value is a current rise threshold, such that if a supplied current rises with a gradient exceeding a predefined absolute value, a fault is detected, and a charging operation is switched off.

* * * * *